United States Patent [19]

Shillady

[11] Patent Number: 4,594,557
[45] Date of Patent: Jun. 10, 1986

[54] TRAVELING WAVE VIDEO DETECTOR

[75] Inventor: Robert W. Shillady, North Wales, Pa.

[73] Assignee: American Electronic Laboratories, Inc., Lansdale, Pa.

[21] Appl. No.: 754,059

[22] Filed: Jul. 11, 1985

[51] Int. Cl.$^4$ .............................................. H03D 1/10
[52] U.S. Cl. ..................... 329/160; 307/320; 329/204; 333/23; 455/337
[58] Field of Search .......... 329/160, 203, 204, 205 R, 329/206; 455/337, 214; 333/23, 168, 204; 307/317 R, 317 A, 320

[56] References Cited

U.S. PATENT DOCUMENTS

| | | | |
|---|---|---|---|
| 1,170,552 | 2/1916 | Meissner | 329/203 X |
| 2,227,906 | 1/1941 | Kellogg | 329/203 X |
| 2,437,493 | 3/1948 | Anderson | 329/203 X |
| 2,468,655 | 4/1949 | Cole et al. | 329/203 X |
| 2,626,990 | 1/1953 | Pierce | 329/160 X |
| 2,629,821 | 2/1953 | Philpott | 329/160 X |
| 2,777,949 | 1/1957 | Haard | 329/160 |
| 2,813,972 | 11/1957 | Anderson et al. | 329/206 X |
| 2,901,613 | 8/1959 | Patterson et al. | 307/317 X |
| 2,919,345 | 12/1959 | Houghton | 329/206 |
| 3,173,091 | 3/1965 | Strull | 329/205 X |
| 3,202,920 | 8/1965 | Riebman | 329/161 |
| 3,212,015 | 10/1965 | Kruse, Jr. | 329/205 |
| 3,226,661 | 12/1965 | Garver et al. | 329/161 X |
| 3,290,516 | 12/1966 | Nishizawa | 329/203 X |
| 3,538,465 | 11/1970 | Manning, Jr. et al. | 329/160 X |
| 3,551,707 | 12/1970 | Seitzer | 307/317 |
| 3,600,708 | 8/1971 | King | 307/320 X |
| 3,609,559 | 9/1971 | Evans | 329/161 X |
| 3,693,103 | 9/1972 | Mouw | 329/205 X |
| 3,705,366 | 12/1972 | Vergnolle | 329/205 X |
| 3,875,535 | 4/1975 | Chang | 307/320 X |
| 3,909,740 | 9/1975 | Clorfeine | 330/287 |
| 4,053,842 | 10/1977 | Turski et al. | 329/205 X |
| 4,075,571 | 2/1978 | Hulderman et al. | 329/205 X |
| 4,219,777 | 8/1980 | Richardson | 329/161 X |
| 4,229,828 | 10/1980 | Baird et al. | 329/161 X |
| 4,249,134 | 2/1981 | Stacey | 329/205 |
| 4,255,730 | 3/1981 | Sekine et al. | 329/161 X |
| 4,271,411 | 6/1981 | Takashi | 329/161 X |
| 4,425,549 | 1/1984 | Schwartz et al. | 329/205 R X |
| 4,465,990 | 8/1984 | Gibson | 329/206 X |

Primary Examiner—Siegfried H. Grimm
Attorney, Agent, or Firm—Seidel, Gonda, Goldhammer & Abbott

[57] ABSTRACT

A traveling wave video detector utilizing microwave integrated circuit techniques provides increased dynamic range, increased rf bandwidth up to 100 Ghz and improved impedance matching at high input power levels. The video detector comprises an artificial transmission line wherein the shunt elements are spaced semiconductor detector diodes which lie in a substantially common plane. In the microwave integrated circuit (MIC) embodiment, the diodes are interconnected by arc shaped wire inductance elements which also lie in a substantially common plane. The particular planar arrangement and location of elements in the present invention provides the desired dynamic range, impedance matching and rf bandwidth.

16 Claims, 14 Drawing Figures

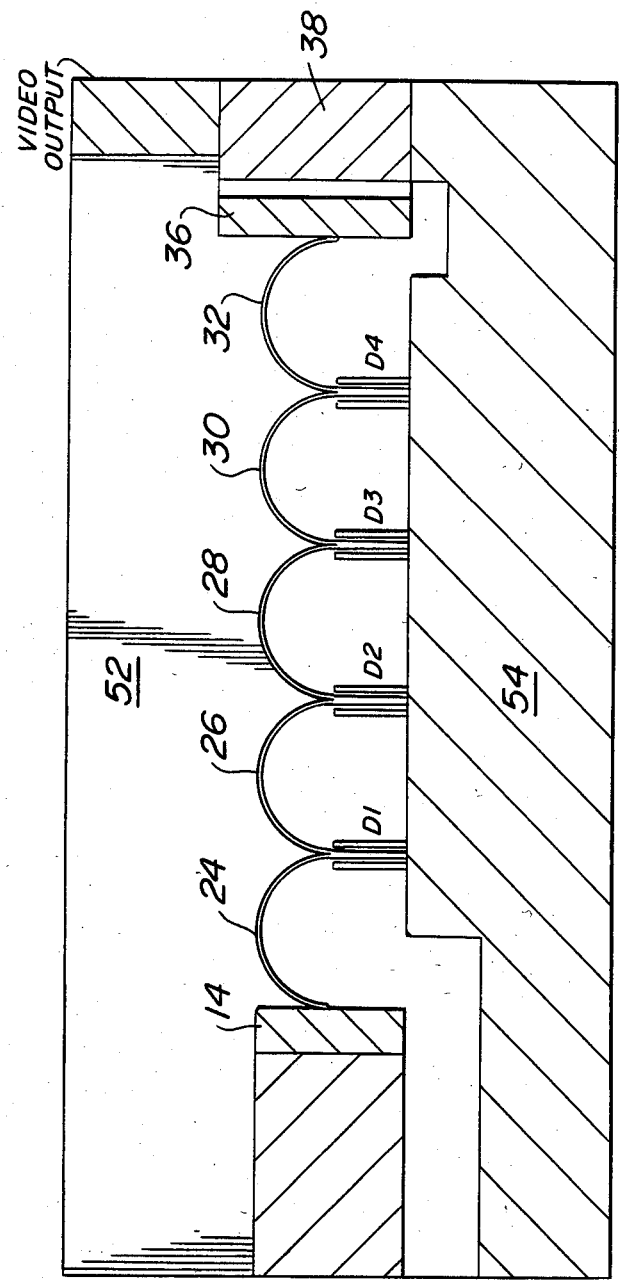
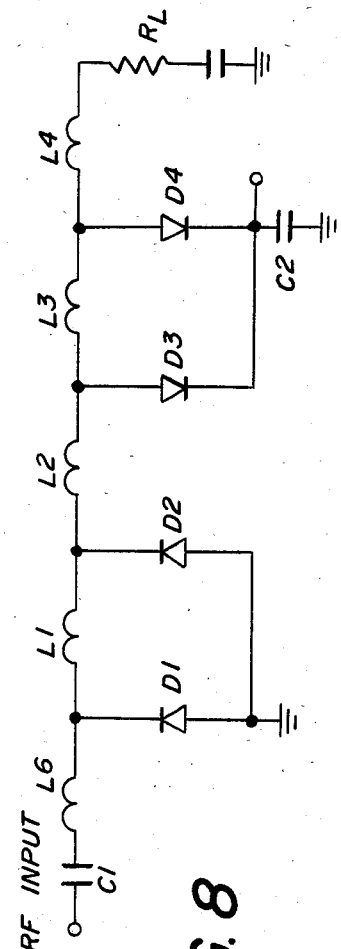
FIG. 5
FIG. 8

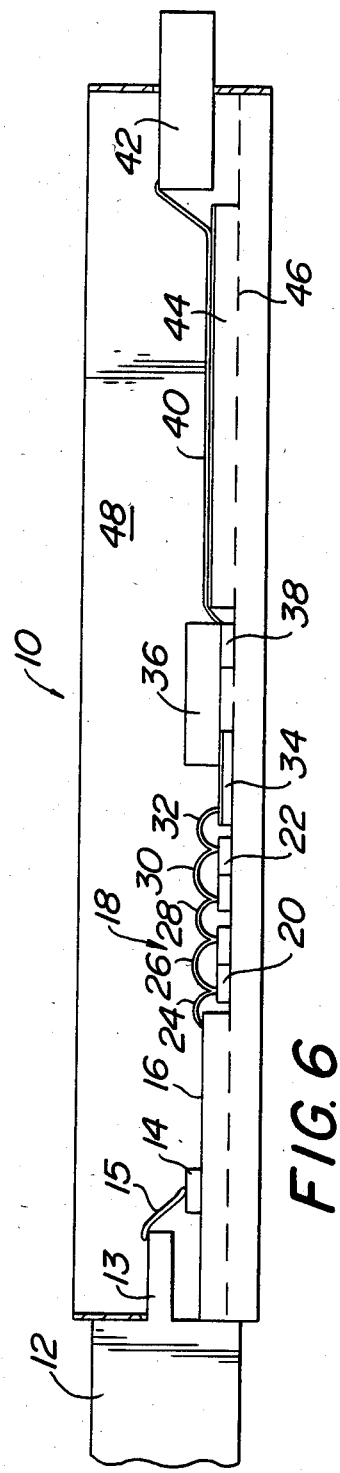
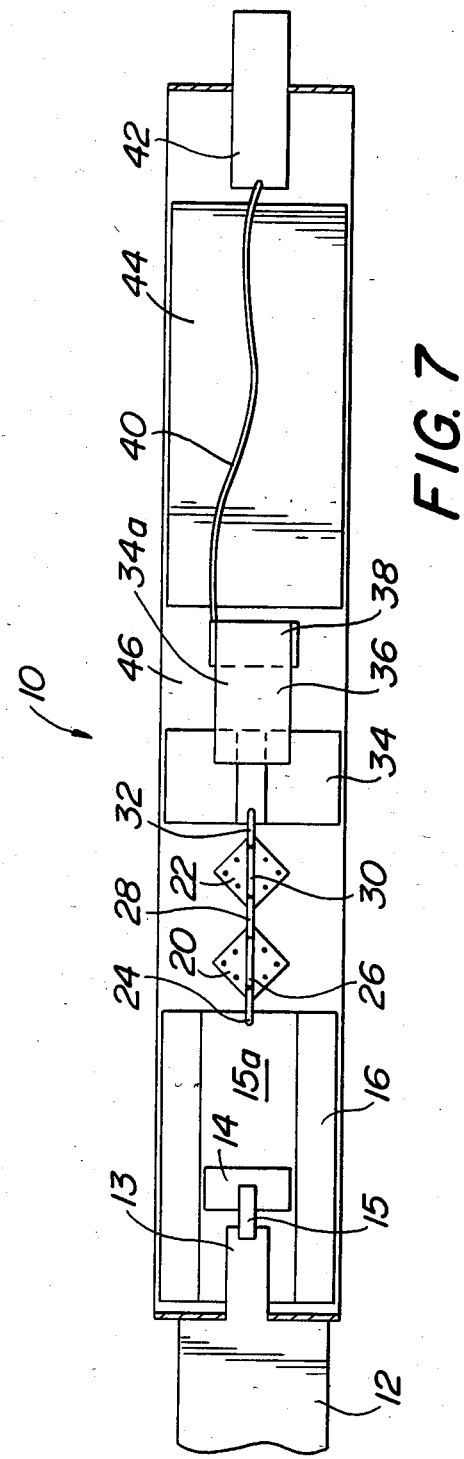

TRAVELING WAVE VIDEO DETECTOR

BACKGROUND OF THE INVENTION

The use of semiconductor diodes per se to provide the capacitive shunt elements of a rf detector-filter circuit is known. See for example U.S. Pat. No. 3,290,516 (Nishizawa) which describes the equivalent filter circuit resulting from the interaction of distributed inductance and diode capacitance with a continuous, helical wire is wound inside a cylindrical sheath and semiconductor diodes are connected directly between the wire and sheath. This particular arrangement provides a bandwidth having an upper limit at approximately 400 Mhz.

Ideally, a video detector will exhibit a good VSWR (less than 2:1) over its bandwidth and its transfer characteristic will follow a square law relationship (i.e., $V_{out} = \gamma P_{IN}$) over all ranges of input power. Known video detectors exhibit a VSWR of about 2.5:1 over a RF bandwidth of 2 to 18 GHz and their transfer characteristic follows the square law relationship only below $-15$ db input power.

The present invention realizes a wide band, travelling wave video detector by utilizing the parasitic junction capacitance of semiconductor diodes in an artificial transmission line. The detector exhibits a good VSWR (less than 2:1) over its RF bandwidth (100 GHz) and its transfer characteristic closely follows the square law relationship for power input levels above $-15$ db while retaining an acceptable video bandwidth (100 MHz).

BRIEF SUMMARY OF THE INVENTION

A traveling wave video detector comprises an artificial transmission line formed by a planar array of elements including plural spaced semiconductor diodes, a first transmission line connected to one of said diodes at the output side of said transmission line, a second transmission line connected between another of said diodes at the output side of said artificial transmission line and a terminating resistance which is substantially equal to the characteristic impedance of the artificial transmission line, said diodes being interconnected in shunt by arc shaped wire segments arranged in a plane so as to form series inductances between adjacent diodes, each inductance being substantially equal to $C \times Z_0^2$ where C is the parasitic junction capacitance of a diode and $Z_0$ is the characteristic impedance of the artificial transmission line.

The detector thus realized exhibits a low VSWR (less than 2:1) over a wide RF bandwidth (to 100 GHz) and its transfer characteristic closely follows the square law relationship over a range of power input levels exceeding $-15$ db while retaining an acceptable video bandwidth (about 100 MHz).

BRIEF DESCRIPTION OF THE DRAWINGS

FIG. 5 is a monolithic microwave integrated circuit (MMIC) layout for the traveling wave video detector.

FIG. 6 is an elevation of a microwave integrated circuit (MIC) embodiment of the traveling wave detector.

FIG. 7 is a top plan view of the microwave integrated circuit embodiment shown in FIG. 6. FIG. 8 is a lumped equivalent circuit of another embodiment of the traveling wave video detector.

DETAILED DESCRIPTION OF THE INVENTION

Figure 1:
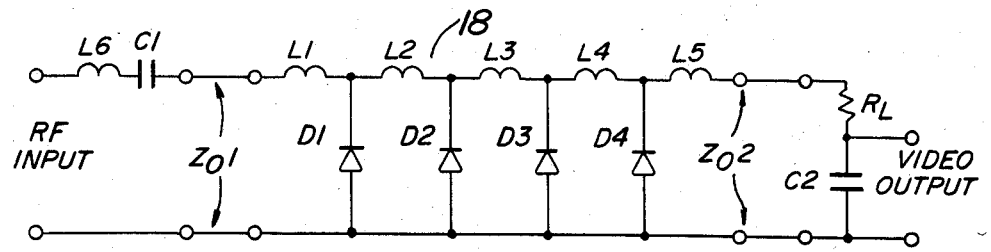
FIG. 1 is the lumped equivalent circuit for the traveling wave video detector of the present invention.

Referring to the drawings, wherein like numerals indicate like elements, there is shown in FIGS. 6 and 7 a microwave integrated circuit embodiment of the traveling wave video detector 10 of the present invention. The traveling wave detector elements are located in a substantially planar array in an elongated rectangular shaped channel between a pair of lands 48, 50. A rf connector 12 having a pin 13 is coupled to a capacitor 14 which is mounted on a short piece of microstrip transmission line 16. Capacitor 14 serves as a dc block so as to prevent bias current from feeding back to the rf connector. The connector pin 13 is coupled to capacitor 14 by a wire 15 which is 18 mils long with a 0.7 mil diameter. Gold wire is preferred. This provides an inductance of 250 picohenries which compensates for discontinuity capacitance at the rf connector interface. Since the discontinuity capacitance may vary with connector type, the length and diameter of wire 15 may be varied to vary the inductance. The position of capacitor 14 may be varied to accomodate variations in the length of wire 15.

The impedance of transmission line 16 is preferably 50 ohms. The transmission line interconnects capacitor 14 with the input side of a traveling wave structure or artificial transmission line 18 comprising multiple semiconductor detector diodes which are formed on chips 20, 22. Chips 20, 22 may be HP5082-9891 chips or the equivalent. The chips are arranged in a common plane as shown in FIGS. 6 and 7. Each chip contains nine separate diodes. In the preferred embodiment disclosed herein only two diodes are utilized on each chip, but the number of diodes used is not intended to be limiting. The parasitic junction capacitance of each diode is approximately 0.1 picofarads. The diodes are interconnected by arc shaped bond wire segments 24, 26, 28, 30 and 32. Each wire segment may be 18 mils long with a diameter of 0.7 mil. Gold wire is preferred. The wire segments 24–32 are arranged in a common plane as shown in FIGS. 6 and 7. The length and diameter of each wire segment, as well as its position above the ground plane, determines its inductance. In the preferred embodiment herein, an inductance of 250 picohenries is obtained to produce a transmission line characteristic impedance of approximately 50 ohms.

The artificial transmission line 18 is connected at its output side by wire segment 32 to a short section of microstrip transmission line 34 which is sized so as to contact and support a terminating resistor 36. The impedance of transmission line 34 is preferably 70 ohms. The terminating resistor may be a thin film chrome metalization or a ceramic substrate having a resistance equal to the characteristic impedance of line 18, namely, 50 ohms. Resistor 36 is also supported by and in contact with a bypass capacitor 38 which is a 5 picofarad ceramic chip. Capacitor 38 provides a short circuit at microwave frequencies while permitting diode bias to be inserted at and video to be extracted from the output side of line 18. The bypass capacitor is connected by a 0.7 mil diameter gold wire 40 to video output pin or terminal 42. As shown in FIGS. 6 and 7, wire 40 extends over a 5 mil thick Kapton insulator 44 which separates capacitor 38 and pin 42.

The preferred dimensions for the elements arranged as shown in FIGS. 6 and 7 are as follows. The central portion 15a of transmission line 16 is approximately 30 mils wide and the transmission line itself is approximately 60 mils wide and 100 mils long. The separation between microstrip transmission lines 16 and 34 is approximately 60 mils. The central portion 34a of transmission line 34 is approximately 10 mils wide, and the transmission line itself is approximately 60 mils wide and 30 mils long. The separation between transmission line 34 and capacitor 38 is approximately 20 mils. As shown in FIG. 6, microstrip transmission line 16 is approximately 10 mils thick while transmission line 34 is approximately 5 mils thick. The wire segments 24–32 are therefore bonded to the chip diodes approximately 5 mils above the ground plane 46. The circuit arrangement illustrated is preferably housed in a casing of rolled steel or Kovar.

The equivalent circuit for the traveling video detector 10 is shown in FIG. 1. Wire 15 is represented by the lumped inductance L6. Capacitor 14 is represented by capacitance C1. The transmission strip 16 is designated Z01. Wire segments 24–32 are represented as lumped inductances L1, L2, L3, L4 and L5. The chip diodes are represented as D1, D2, D3 and D4. Transmission strip 34 is designated as Z02. The terminating resistor 36 is represented as resistance $R_L$. The bypass capacitor 38 is represented by capacitance C2.

Figure 2:
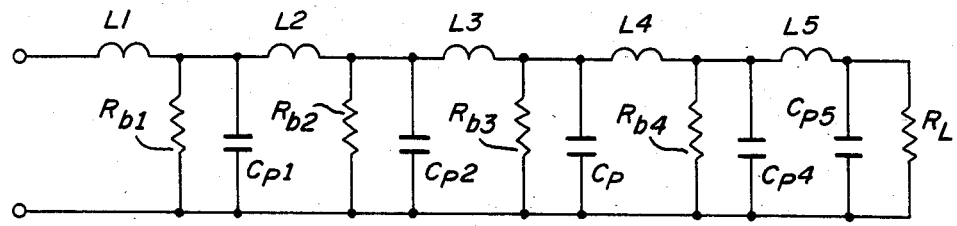
FIG. 2 is the rf equivalent circuit for the traveling wave video detector.

The circuit shown in FIG. 2 is the rf equivalent circuit for the traveling wave detector of the present invention. In FIG. 2, the diodes D1–D4 are replaced by their circuit equivalents. The barrier resistance of each diode is represented as Rb1–Rb4. For the chip diodes utilized herein, the barrier resistance is typically 1000 ohms. The parasitic junction capacitance of each diode is represented as Cp1–Cp4. The shunt parasitic capacitance of terminating resistance $R_L$ is designated Cp5. This capacitance is minimized by positioning the terminating resistor 36 as shown in FIGS. 6 and 7.

Figure 3:
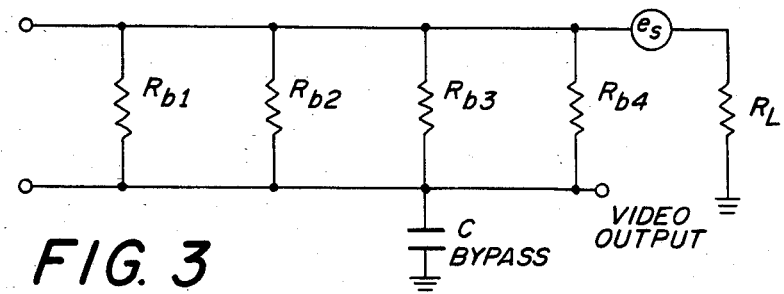
FIG. 3 is the video equivalent circuit without accounting for shot noise.

The video equivalent circuit for the traveling wave detector is shown in FIG. 3 wherein wire inductances L1–L5 are essentially shorts and the diode parasitic capacitances Cp1–Cp4 and capacitance Cp5 are essentially open circuits.

Figure 4:
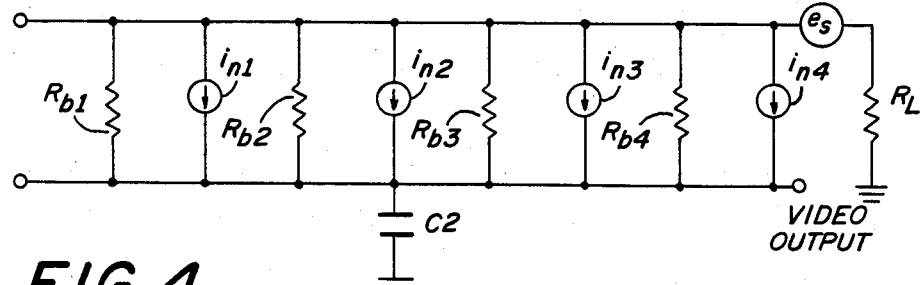
FIG. 4 is the video equivalent circuit accounting for shot noise.

The equivalent circuit shown in FIG. 4 accounts for diode shot noise. Johnson noise is considered negligible in comparison to the shot noise and, accordingly, is not represented in FIG. 4. The shot noise generated by each diode is represented by noise current generators in1, in2, in3 and in4. The current flowing to the video output terminal is equal to the square root of the sum of the squares of the noise current generators:

$$in(\text{sum}) = \sqrt{(in1)^2 + (in2)^2 + (in3)^2 + (in4)^2}$$

Since the diode shot noise currents are random and independent, while the diode rf signal currents are in phase, and since most of the rf signal power flows to the terminating resistance rather than to the diode junctions, the detector can be operated over a wide range of diode bias currents without seriously affecting performance or deteriorating VSWR. Because the effective rf load of the detector is the terminating resistance $R_L$, rather than the diode barrier resistances (which have non-linear characteristics), the detector will operate over an increased dynamic range of rf power input levels.

Referring to FIG. 5, there is shown a monolithic microwave integrated layout for the traveling wave detector of the present invention. In FIGS. 5, cross-hatched areas represent metalization. The circuit elements are formed on a semi-insulating gallium-arsenide substrate 52. A silicon substrate may be employed instead, with some sacrifice in performance. The substrate thickness is preferably 10 mils. The substrate is 14 mils wide, 30 mils long and 10 mils thick. The layout includes a ground metalization area 54 connected to diodes D1–D4. Preferably, each diode is formed by a FET wherein the source and drain are shorted together. The FET gate width is preferably 50 microns and the gate length is preferably 1 micron. Each of the arc shaped conductors 24–32 is approximately 6 microns wide and 150 microns long. The parasitic capacitance of each detector diode D1–D4 is 25 femtofarads. To obtain a transmission line characteristic impedance of 50 ohms, then, the inductance of each conductor 24–32 is 62.5 picohenries.

Capacitor 14 is located toward the left side of the substrate. If a ground plane is employed on the back side of the substrate, capacitor 14 may be formed from a short piece of microstrip transmission line. The value of capacitor 14 is 5 picofarads. The terminating resistor 36 and bypass capacitor 38 are formed on the right side of the substrate. The value of capacitor 38 is 5 picofarads. The value of terminating resistance 36 is 50 ohms. The video output terminal is formed in the upper right hand corner.

The circuit thus described has exhibited a wide RF bandwidth of up to 100 GHz, a low VSWR of less than 2:1 and an acceptable video bandwidth of about 100 MHz. Moreover, this circuit arrangement exhibits a transfer characteristic which closely follows a square law relationship for power input levels exceeding −15 db.

Referring to FIG. 8, there is shown an alternative diode arrangement for the traveling wave detector. This arrangement can be used to obtain a detector figure of merit in the order of 800 millivolts/milliwatts. By utilizing this configuration, the rf signal voltages developed by the diodes can be made to add. If, in contrast to FIG. 8, the diodes were poled in the same direction as in FIG. 1, the diode rf signal voltages would not add, thereby limiting the figure of merit somewhat. The circuit of FIG. 8 exhibits substantially the same operating characteristics as those described above in connection with FIGS. 6 and 7.

Figure 9:
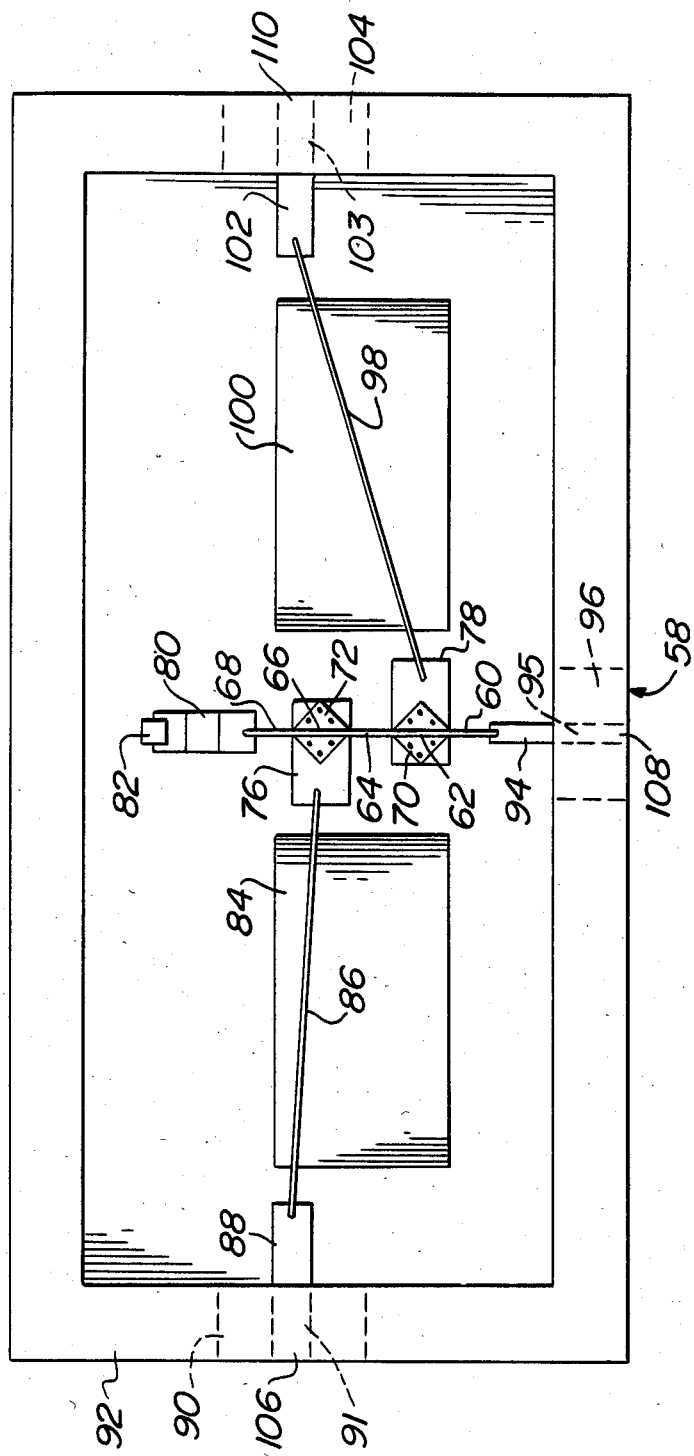
FIG. 9 is a top plan view of a microwave integrated circuit embodiment of a serially balanced detector realized according to the principles of the invention.
Figure 10:
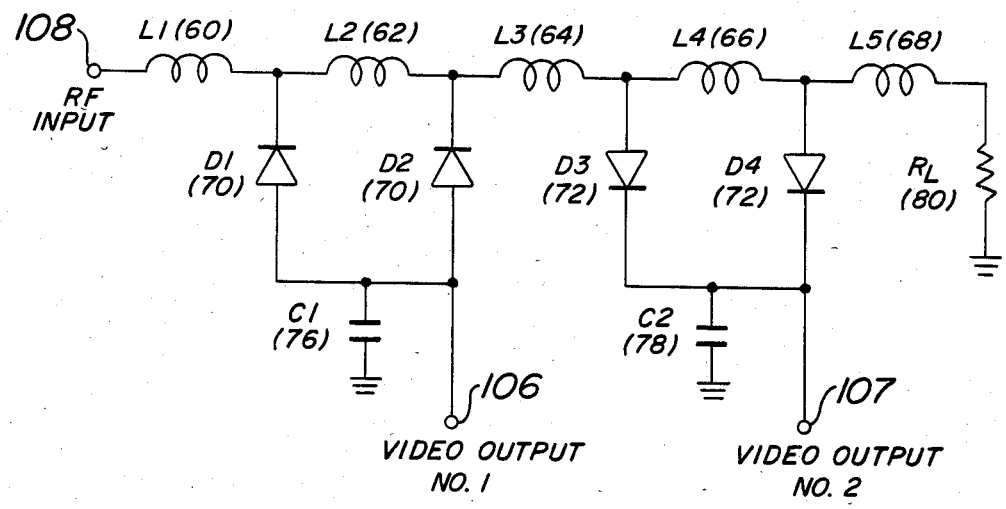
FIG. 10 is a schematic illustration of the lumped equivalent circuit for the embodiment of FIG. 9.
Figure 12:
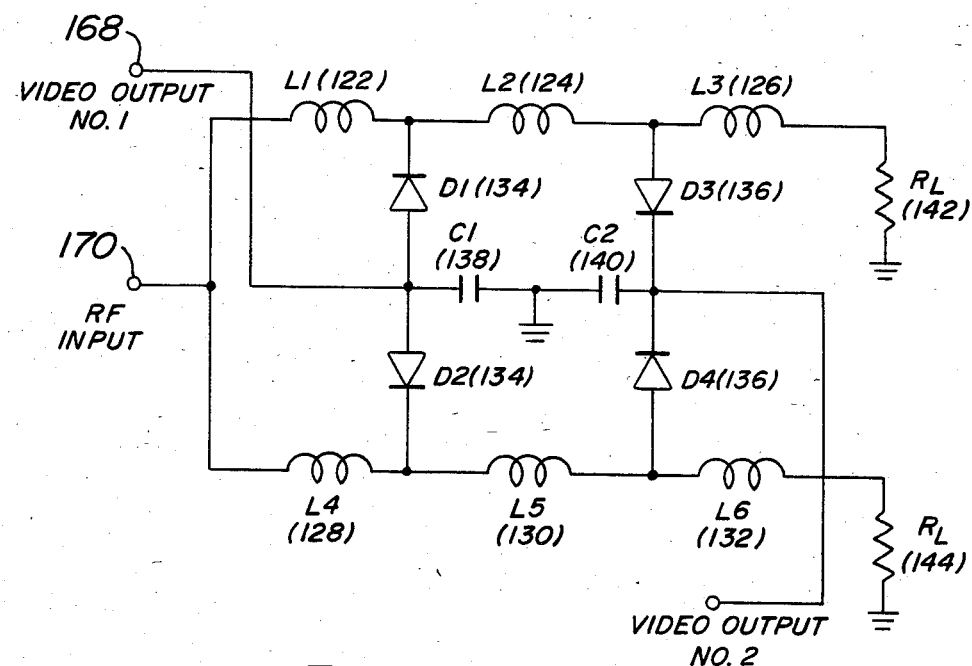
FIG. 12 is a schematic illustration of the lumped equivalent circuit for the embodiment of FIG. 11.
Figure 11:
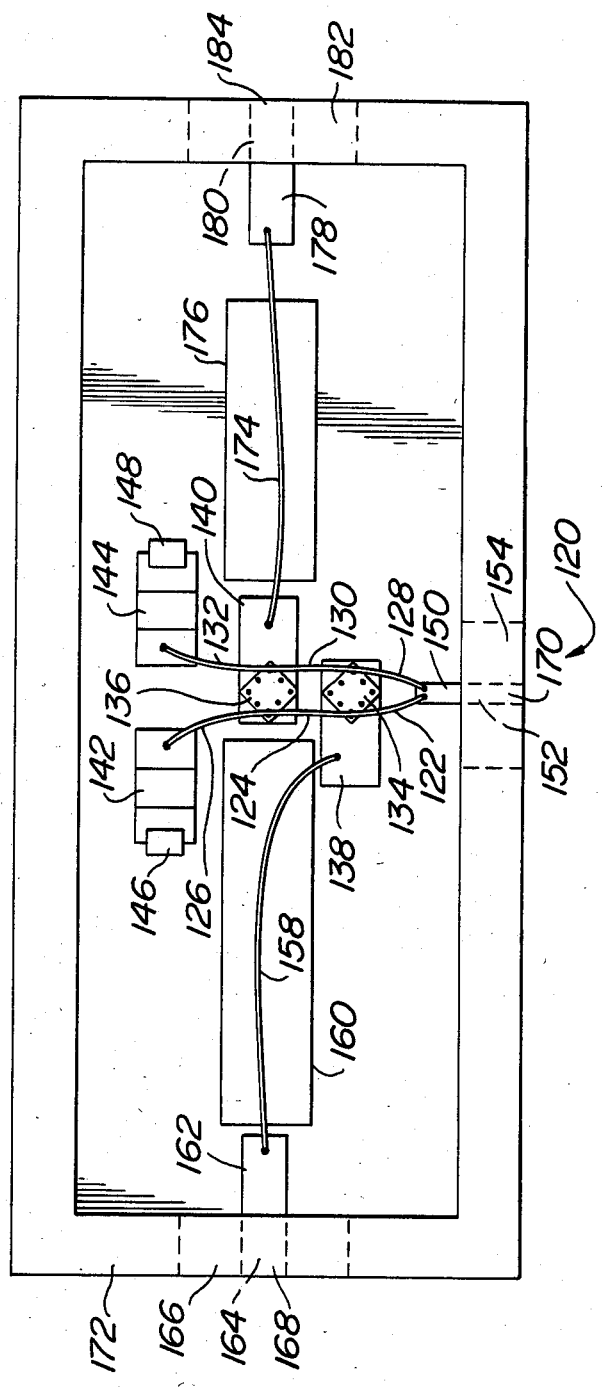
FIG. 11 is a top plan view of a microwave integrated circuit embodiment of a parallel balanced detector realized according to the principles of the present invention.

Referring to FIGS. 9–12, there are shown two additional embodiments of the invention. FIG. 9 is a microwave integrated circuit embodiment of the circuit schematically illustrated in FIG. 10. FIG. 11 is a microwave integrated circuit embodiment of the circuit schematically illustrated in FIG. 12. The travelling wave video detectors illustrated in FIGS. 9–12 are balanced detector designs which produce both a negative and positive polarity signal, effectively doubling the video output level of the detector. The detector illustrated in FIG. 12 is a parallel balanced design. Two identical diode artificial transmission lines (L1, L2, L3, D1 and D3 forming the first transmission line and L4, L5, L6, D2 and D4 forming the second transmission line), each with a 100 ohm characteristic impedance, are parallel at the RF input 170 to produce a 50 ohm impedance. The load resistors $R_L$ are each 100 ohms to match the value of the characteristic impedance. The detector schematically illustrated in FIG. 10 is a serially balanced design. The detector of FIG. 10 contains four identical transmission line sections (L1, D1 forming the first section, L2, D2 forming the second section, L3, D3 forming the third section and L4, D4 forming the fourth section), with the exception that diodes D1, D2 are biased oppositely from diodes D3, D4. The characteristic impedance of the design of FIG. 10 is 50 ohms.

Referring now to FIG. 9, the construction of a microwave integrated circuit embodiment of the travelling wave video detector schematically illustrated in FIG. 10 will be explained. A microwave integrated circuit travelling wave video detector 58 is housed in a Kovar module 92. The dimensions of the Kovar module are preferably 0.75 inches long by 0.24 inches wide. An RF input 108 comprises a Kovar wire 95 bonded to a Kovar pin 94. Kovar wire 95 is encapsulated in a glass housing 96. An artificial transmssion line comprises arc shaped bond wire segments 60, 62, 64, 66, 68, multiple semiconductor detector diodes formed on chips 70, 72, capacitors 76, 78 and resistor 80. Each of the wire segments 60–68 have an inductance of 250 picohenries and are schematically illustrated as L1–L5, respectively, in FIG. 10.

Wire segment 60 interconnects pin 94 to the cathode of a diode D1 on chip 70. Wire segment 62 interconnects the cathode of diode D1 to the cathode of another diode D2 on chip 70. Wire segment 64 interconnects the cathode of diode D2 to the anode of a diode D3 on chip 72 and wire segment 66 connects the anode of diode D3 to the anode of a diode D4 on chip 72. The anode of diode D4 is connected to a 50 ohm terminating resistor 80 which is grouned to the housing 92 at the opposite end. Resistor 80 has a gold ribbon wrap-around 82 on its end to provide the ground connection. Semiconductor chip 70, which preferably is a Schottky 3451505 is mounted on a 25 picofarad capacitor 78. Semiconductor chip 72, which is preferably a Schottky 3451400, is mounted on a 25 picofarad capacitor 76. The anodes of diodes D1 and D2 on semiconductor chip 70 are electrically connected to one side of capacitor 78 and the opposite side of capacitor 78 is grounded to Kovar module 92 as schematically illustrated in FIG. 10. Similarly, the cathodes of diodes D3 and D4 on semiconductor chip 72 are electrically connected to one side of capacitor 78 having its opposite side grounded to Kovar housing 92, as illustrated in FIG. 10.

A 0.7 mil diameter gold wire 86 connects capacitor 76 to a connector pin 88 electrically connected to a Kovar wire 91 encased as a glass enclosures 90. Kovar wire 91 leads to a first video output 106. Another 0.7 mil diameter gold wire 98 connects capacitor 78 to a connector pin 102. Connector 102 is electrically connected to a Kovar wire 103 encased in a glass enclosure 104. Kovar wire 103 leads to a second video output 110. Wires 86, 98 are insulated from the housing 92 by small pieces of Kapton 84, 100 which are preferably 5 mils thick.

Referring now to FIG. 11, the construction of a microwave integrated circuit embodiment of the circuits schematically illustrated in FIG. 12 will be explained. A travelling wave video detector 120 is housed in a Kovar module 172, again preferably 0.75 inches long by 0.24 inches wide. An RF input 170 comprises a Kovar wire 152 encased in a glass enclosure 154 and wire 152 is electrically connected to a Kovar pin 150. A first artificial transmission line comprises arc shaped wire segments 122, 124, 126 diode D1 resident on semiconductor chip 134, diode D3 resident on semiconductor chip 136 and a 100 ohm terminating resistor 142. A second artificial transmission line comprises arc shaped wire segments 128, 130 and 132, diode D2 resident on semiconductor chip 134, diode D4 resident on semiconductor chip 136 and a 100 ohm terminating resistor 144. Wire segments 122, 124 and 126 correspond to inductors L1–L3, respectively, schematically illustrated in FIG. 12. Wire segments 128, 130 and 132 correspond to inductors L4–L6, respectively, schematically illustrated in FIG. 12. Preferably, the inductance of each of the wire segments 122–132 is one nanohenry. Referring to the first artificial transmission line, wire segments 122 interconnects Kovar pin 150 to the cathode of a diode D1 resident on semiconductor chip 134. Wire segment 124 interconnects the cathode of diode D1 to the anode of diode D3 resident on semiconductor chip 133. Wire segment 126 interconnects the anode of diode D3 to 100 ohm terminating resistor 142. Referring to the second artificial transmission line, wire segment 128 interconnects Kovar pin 150 to the cathode of diode D2 resident on chip 134. Wire segment 130 interconnects the cathode of diode D2 to the anode of D4 resident on semiconductor chip 136. Wire segment 132 interconnects the anode of diode D4 to 100 ohm terminating resistor 144. As shown in FIG. 12, the anodes of diodes D1 and D2 are directly connected, as are the cathodes of diodes D3 and D4. Semiconductor chips 134, 136 are mounted on 25 picofarad capacitors 138, 140, respectively. The anodes of diodes D1 and D2 are connected to one side of capacitor 138 and the opposing side of capacitor 138 is grounded to the Kovar housing 172. Similarly, the cathodes of diodes D3 and D4 are connected to one side of capacitor 140 and the opposite side thereof is grounded to the Kovar housing 172. Resistor 142 has a gold ribbon wrap-around 146 on the end opposite the end receiving wire segment 126 for grounding to the Kovar module 172. Similarly, resistor 144 has a gold ribbon wrap-around 148 on the end opposite the end receiving wire segment 132 for grounding to Kovar module 172. As in the prior embodiments, the semiconductor detector diode chips 134, 136 are preferably Schottky 3451400 and 3451505, respectively.

A 0.7 mil diameter gold wire connects capacitor 138 to a Kovar pin 162. Wire 158 is insulated from the housing 172 by a small piece of Kapton insulation 160. Connector 162 is electrically connected to a Kovar wire 164 encased in a glass enclosure 166. Wire 164 leads to a first video output 168.

A 0.7 mil diameter gold wire 174 interconnects capacitor 140 to a Kovar connector 178. Connector 178 is electrically connected to a Kovar wire 180 which is encapsulated in a glass housing 182. Wire 180 leads to a second video output 184.

In the embodiments illustrated in FIGS. 9-12, dc blocking capacitors are not required at the input. The video signal is extracted at the point in the circuit where bias is inserted, and therefore the diodes are mounted on the capacitors to provide bypassing of the RF signal. The frequency range of the designs illustrated in FIGS. 9-12 to 0.5 to 6.6 Ghz, but the design technique can be utilized to cover higher frequency ranges.

Figure 13:
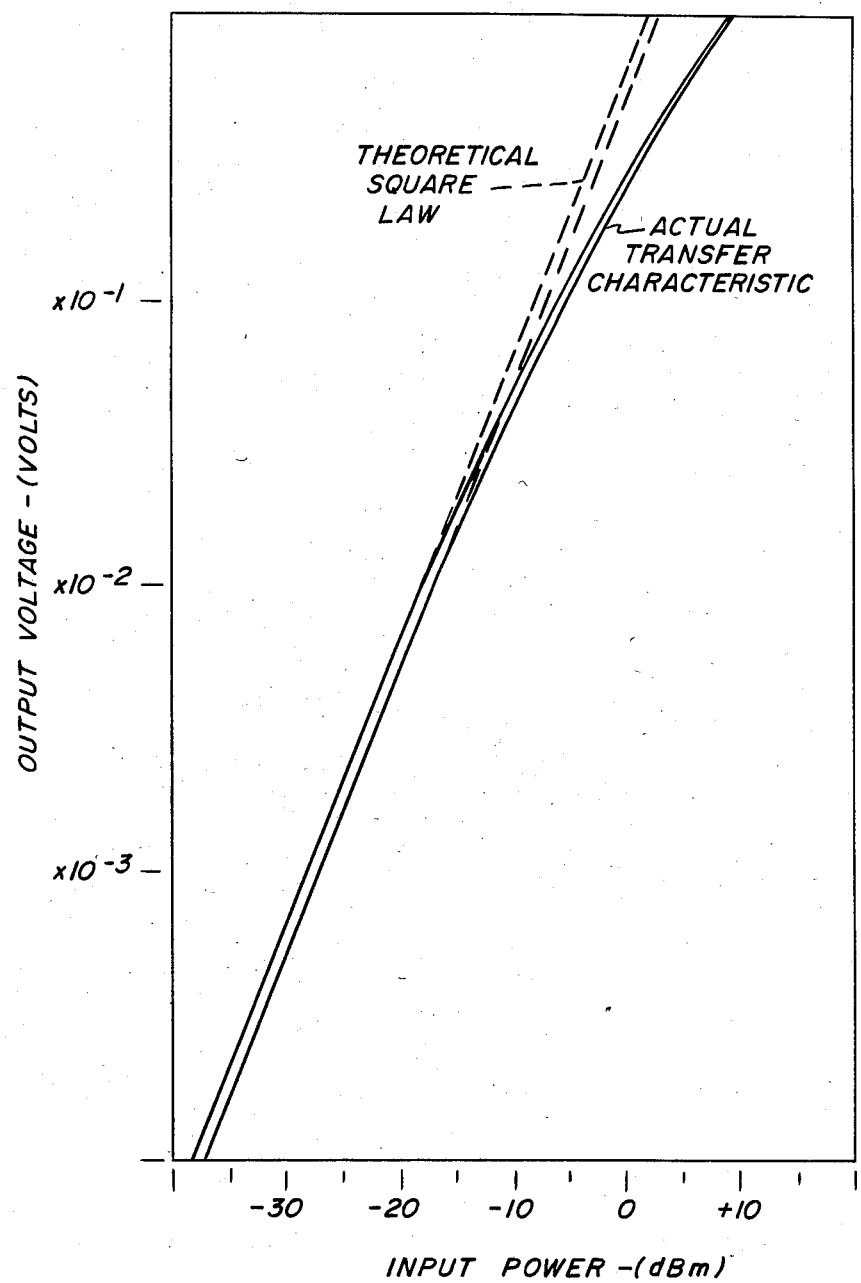
FIG. 13 is a graph illustrating the transfer characteristic of the embodiment of FIG. 9.
Figure 14:
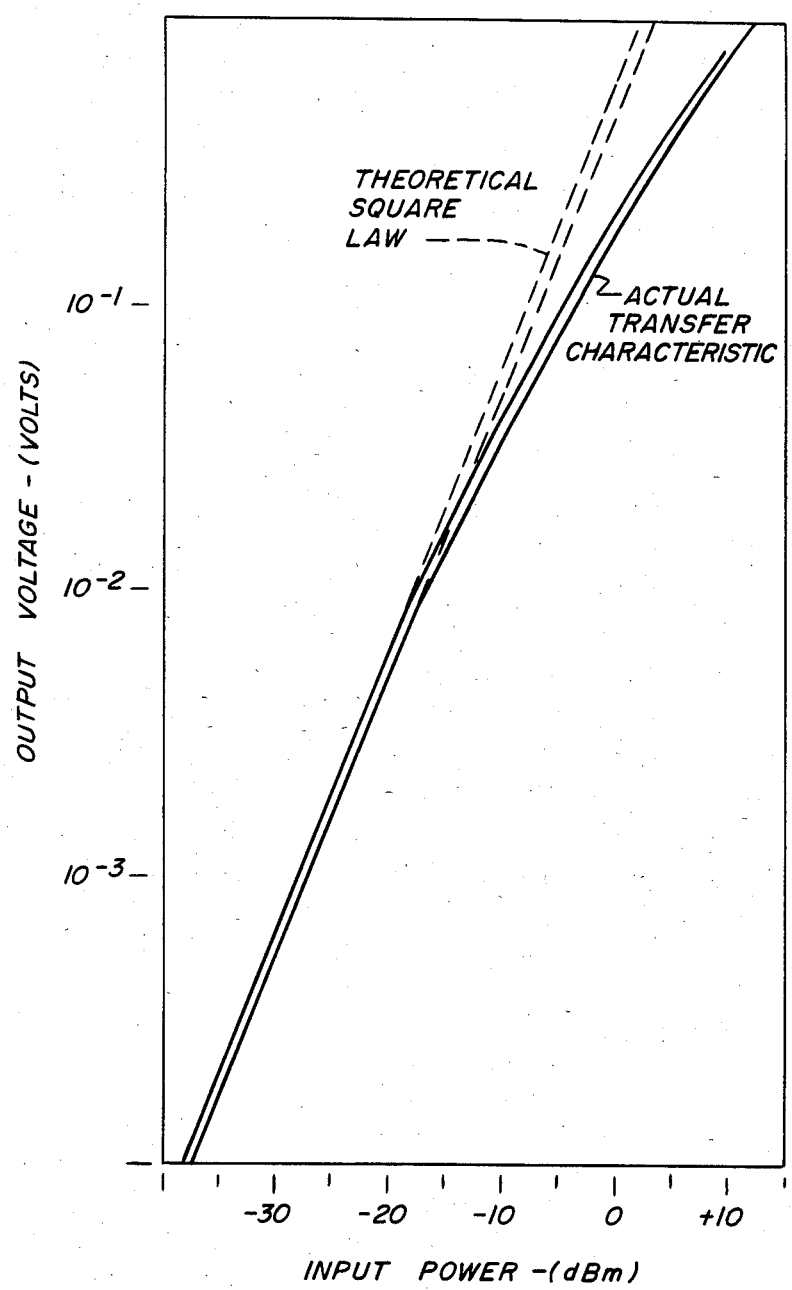
FIG. 14 is a graph illustration of the transfer characteristic of the embodiment of FIG. 11.

FIGS. 13 and 14 graphically depict the transfer characteristics of the embodiments of FIGS. 9 and 11. FIG. 13 illustrates the transfer characteristic of the embodiment of FIG. 9 and FIG. 14 illustrates the transfer characteristic of the embodiment of FIG. 11.

As illustrated in FIG. 13, the transfer characteristic of the embodiment of FIG. 9 follows, nearly exactly, the square law relationship for power input levels up to $-15$ db. For power levels above $-15$ db, the actual transfer characteristic deviates only slightly from the theoretical square law relationship. Similarly, referring to FIG. 14, the embodiment of FIG. 11 follows, nearly exactly, the square law relationship for power input levels up to $-13$ db. Above $-13$ db, the actual transfer characteristic deviates only slightly from the theoretical square law.

The present invention may be embodied in other specific forms without departing from the spirit of essential attributes thereof and, accordingly, reference should be made to the appended claims, rather than to the foregoing specification, as indicating the scope of the invention.

I claim:

1. Traveling wave video detector, comprising:
   an artificial transmission line formed by a planar array of elements including plural spaced diodes,
   a first transmission line connected to one of said diodes at the input side of said artificial transmission line,
   a terminating resistor and a second transmission line connected between another of said diodes which is at the output side of said artificial transmission line and the terminating resistor, the impedance of said terminating resistor being substantially equal to the characteristic impedance of the artificial transmission line,
   said diodes being interconnected in shunt by wires arranged in successive arcs in a plane, each wire having a length and diameter so as to form an inductance between adjacent diodes, each inductance being substantially equal to $C \times Z_0^2$ where C is the parasitic junction capacitance of a diode and $Z_0$ is the value of the characteristic impedance of the artificial transmission line.

2. Traveling wave video detector according to claim 1 wherein the rf equivalent circuit of each diode is represented by the shunt connection of the diode barrier resistance and the diode parasitic junction capacitance.

3. Traveling wave video detector according to claim 2 wherein said barrier resistance is approximately 1000 ohms and said parasitic junction capacitance is approximately 0.1 picofarads.

4. Traveling wave video detector according to claim 1 wherein said artificial transmission line characteristic impedance is approximately 50 ohms.

5. Traveling wave video detector according to claim 1 wherein said diodes are arranged in pairs, the diodes in each pair being poled in the same direction, and consecutive pairs of diodes being oppositely poled.

6. Traveling wave video detector according to claim 1 including a capacitor coupled to said diode at the input side of said artificial transmission line for blocking bias current from feeding back to an rf source.

7. Traveling wave video detector according to claim 6 including an inductance connected in series with said bias current blocking capacitor for compensating for connector discontinuity capacitance at the input side of the artificial transmission line.

8. Traveling wave video detector according to claim 6 wherein said bias current blocking capacitor is a ceramic chip capacitor mounted on said first transmission line, and wherein said series inductance for compensating for connector discontinuity is formed by a wire connected to the bias current blocking capacitor.

9. Traveling wave video detector according to claim 8 wherein said series inductance for compensating for connector discontinuity is variable as a function of the length and diameter of said wire connected to said bias current blocking capacitor.

10. Traveling wave video detector according to claim 1 wherein the value of each inductance is approximately 250 picohenries.

11. Traveling wave video detector according to claim 1 wherein said first transmission line is approximately 100 mils long and 60 mils wide.

12. Traveling wave video detector according to claim 1 wherein said second transmission line is approximately 30 mils long and 60 mils wide.

13. Traveling wave video detector according to claim 1 wherein said diodes are formed on integrated circuit chips disposed in a substantially common plane between said first and second transmission lines.

14. Traveling wave video detector according to claim 1 wherein said terminating resistor is a thin film chrome metalization.

15. Traveling wave video detector according to claim 1 wherein said terminating resistor is a ceramic substrate.

16. Traveling wave video detector according to claim 1 wherein each of said arc shaped wires is approximately 18 mils long and 0.7 mils in diameter.

* * * * *